US011334458B2

(12) United States Patent
Wilson et al.

(10) Patent No.: US 11,334,458 B2
(45) Date of Patent: May 17, 2022

(54) COMPLETING MEMORY REPAIR OPERATIONS INTERRUPTED BY POWER LOSS

(71) Applicant: Micron Technology, Inc., Boise, ID (US)

(72) Inventors: Alan J. Wilson, Boise, ID (US); Donald Martin Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 92 days.

(21) Appl. No.: 17/005,027

(22) Filed: Aug. 27, 2020

(65) Prior Publication Data

US 2022/0066893 A1 Mar. 3, 2022

(51) Int. Cl.
*G06F 11/00* (2006.01)
*G06F 11/20* (2006.01)
*G11C 29/00* (2006.01)
*G06F 1/30* (2006.01)

(52) U.S. Cl.
CPC ............ *G06F 11/2094* (2013.01); *G06F 1/30* (2013.01); *G11C 29/702* (2013.01); *G11C 29/787* (2013.01); *G11C 29/88* (2013.01)

(58) Field of Classification Search
CPC ... G11C 29/787; G11C 17/14–18; G06F 1/30; G06F 11/2094
See application file for complete search history.

(56) References Cited

U.S. PATENT DOCUMENTS

| | | | | |
|---|---|---|---|---|
| 7,111,193 B1* | 9/2006 | Hsieh | ................... | G11C 29/785 |
| | | | | 365/200 |
| 8,352,672 B2* | 1/2013 | Suda | ..................... | G11C 16/20 |
| | | | | 711/103 |
| 10,242,734 B1* | 3/2019 | Khakifirooz | ....... | G11C 16/3427 |
| 2002/0133769 A1* | 9/2002 | Cowles | .................. | G11C 29/44 |
| | | | | 714/719 |
| 2002/0138676 A1* | 9/2002 | Kendall | ................ | G06F 3/0679 |
| | | | | 710/74 |
| 2019/0042375 A1* | 2/2019 | Bradshaw | ............. | G06F 3/0679 |
| 2020/0176072 A1* | 6/2020 | Nale | ..................... | G11C 29/76 |

* cited by examiner

*Primary Examiner* — Michael Maskulinski
(74) *Attorney, Agent, or Firm* — Holland & Hart LLP

(57) ABSTRACT

Methods, systems, and devices for completing memory repair operations interrupted by power loss are described. A command to perform a memory repair of a memory device may be received. A memory repair process of the memory device may be initiated, based on the command. The memory repair process may include programming fuse elements of the memory device. Information associated with the initiated memory repair process may be stored in a non-volatile memory. The memory repair process may be interrupted by a power interruption. During powerup of the memory device, it may be determined that the memory repair process was initiated and not completed before the powerup, based on the stored information. The memory repair process of the memory device may be continued, based on the determination. Upon completion of the memory repair process, the stored information may be cleared.

20 Claims, 7 Drawing Sheets

COMPLETING MEMORY REPAIR OPERATIONS INTERRUPTED BY POWER LOSS

BACKGROUND

The following relates generally to one or more systems for memory and more specifically to systems and methods for completing memory repair operations interrupted by power loss.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Memory cells may develop defects after placement of memory dies into memory devices (e.g., chip packages). To account for these defects, some memory devices may include replacement memory cells that may be used to replace (e.g., "repair") the defective memory cells in a memory repair operation, a process that may be known as post-packaging repair (PPR). In PPR, when a defect occurs in a memory cell, the defective memory cell may be disabled and a corresponding replacement memory cell may be enabled to replace the defective memory cell. In some cases, PPR may replace a row of memory cells with a replacement row. In this application, "memory repair operation" and "PPR" may be used interchangeably.

Some systems may provide for PPR by dedicating a small number of rows of memory cells that are configured to repair (e.g., "replace") a defective row of memory cells post-packaging. These replacement rows may be referred to as "redundant rows."

During enabling and disabling of the memory rows, a power interruption to the memory device may occur, e.g., due to a power outage or a hard reset of the memory device. If the power interruption occurs during a PPR (e.g., after initiation of the PPR and before the PPR has completed), the replacement row may become unusable. In that case, both the defective row and the replacement row may be unusable.

Systems, devices, and techniques are described that allow for the continuation of a memory repair, e.g., a PPR, of a memory device after a power interruption. After power is restored, the memory device may determine that the memory repair was initiated but not completed before power was lost. To accomplish this, the memory device may store repair information to non-volatile memory at initiation of the memory repair. When power is restored, the memory device may determine that the memory repair was initiated and not completed by reading the repair information from the non-volatile memory. This may allow memory repairs to be completed even after a power interruption.

Features of the disclosure are initially described in the context of systems and dies as described with reference to FIGS. 1-2. Features of the disclosure are described in the context of a system and a flow diagram as described with reference to FIGS. 3-4. These and other features of the disclosure are further illustrated by and described with reference to an apparatus diagram and flowcharts that relate to completing memory repair operations interrupted by power loss as described with reference to FIGS. 5-7.

Figure 1:
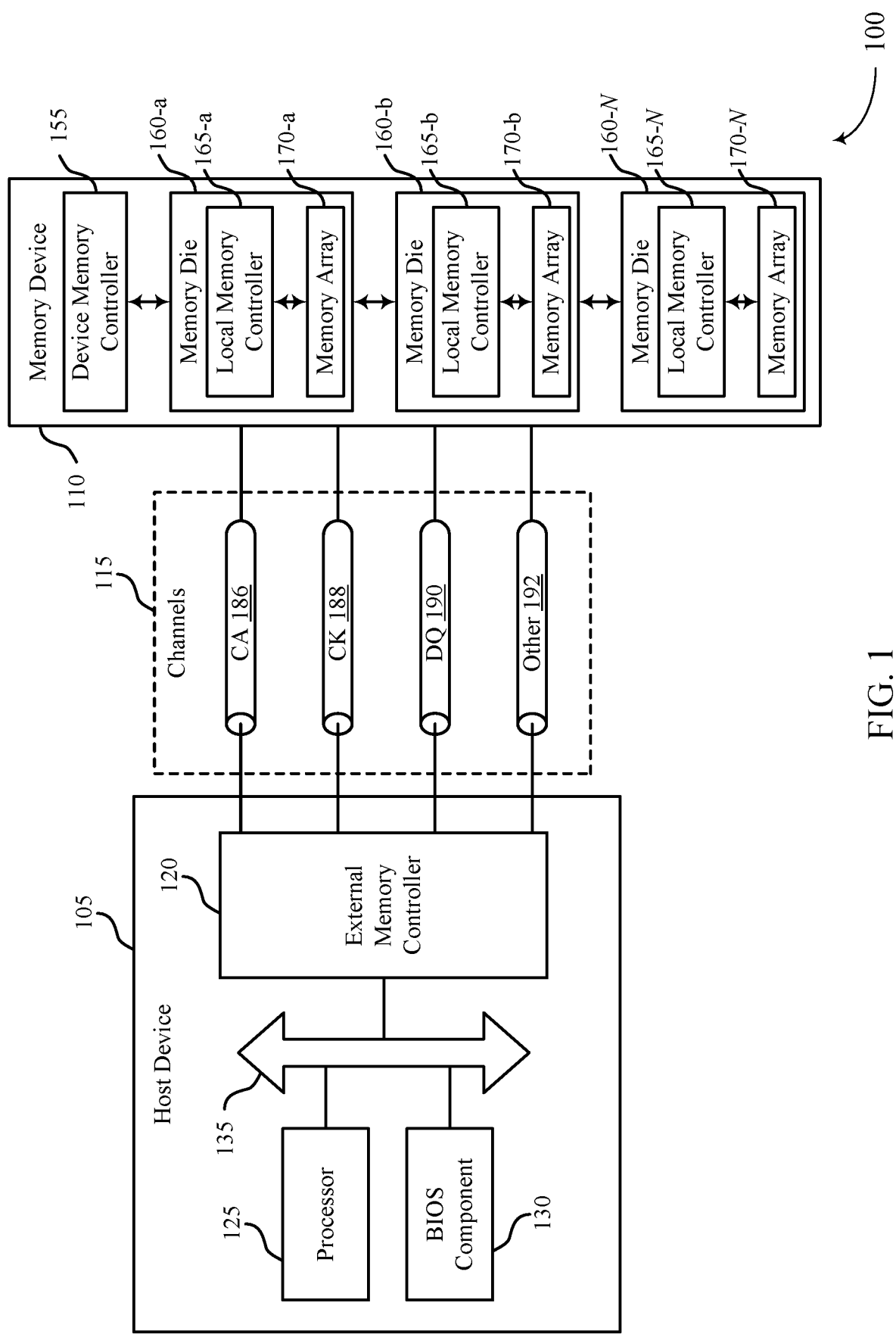
FIG. 1 illustrates an example of a system that supports completing memory repair operations interrupted by power loss in accordance with examples as disclosed herein.

FIG. 1 illustrates an example of a system 100 that supports completing memory repair operations interrupted by power loss in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105. In some examples, the host device may initiate a memory repair operation, e.g., a PPR operation. For example, the host device may determine that one or more memory cells (e.g., one or more rows of memory cells) of a memory array (e.g., memory array 170-$a$) are defective. Accordingly, the host device may request that the memory device 110 commence a memory repair operation. For example, the host device may transmit an "Enter PPR" command to the memory device 110, which may result in the memory device 110 ceasing ordinary operations (e.g., ordinary access operations). Additionally or alternatively, the host device may transmit an "ACT command" (e.g., an activate command) to the memory device, which may initiate the memory repair operation (e.g., PPR operation) as described herein.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. The memory device 110 may include one or more memory arrays that include a plurality of redundant rows (e.g., redundant rows 325-$a$, 325-$b$, and 325-$n$ as described with reference to FIG. 3) and a fuse array coupled with the memory array (e.g., a fuse array 330 as described with reference to FIG. 3). The memory device 110 may also include a repair information set (e.g., a repair information set 360 as described with reference to FIG. 3). In some examples, the memory device 110 may include a fuse logic circuit (e.g., a fuse logic circuit 345 as described with reference to FIG. 3) that is configured to carry out one or more aspects of a memory repair operation as described herein The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. In some examples, the memory array 170 may include a plurality of redundant rows of memory cells (e.g., redundant rows 325-$a$, 325-$b$, and 325-$n$) configured for use in a memory repair. The redundant rows may each correspond to a bank (row) of storage elements (e.g., a fuse or anti-fuse bank), and the redundant rows may serve as "replacement" rows for a defective prime row (e.g., a defective row of memory array 170). Note that wherever "storage element" or "fuse" is used herein, it is to be understood that a fuse or an anti-fuse or other one-time programmable storage element may be used, and that in some cases a non-volatile but reprogrammable storage element may be used.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

In some examples, the local memory controller 165 may facilitate a memory repair operation, e.g., a PPR operation. For example, the local memory controller 165 may receive a row address that corresponds to a defective row of memory cells (e.g., of memory array 170). In some examples, the row address may be received from a host device 105. The local memory controller 165 may then determine a bank of storage elements to use, set a repair flag, and store the repair flag and the received row address in non-volatile memory. The local memory controller 165 may then begin storing the received row address in the bank of storage elements. After a power interruption, the local memory controller 165 may obtain a repair flag, a row address, and an identification of a bank of storage elements from non-volatile memory and determine, by the repair flag, that the storing of the row address in the identified bank of storage elements was initiated and not completed. The local memory controller 165 may continue storing the row address in the bank of storage elements, determine if the storing was successfully completed, and update the repair flag in the non-volatile memory accordingly. Further, in some cases, a memory controller such as a local memory controller 165 or device memory controller 155 may perform one or more operations or functions otherwise ascribed herein to a fuse logic circuit 345 as described with reference to FIG. 3.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
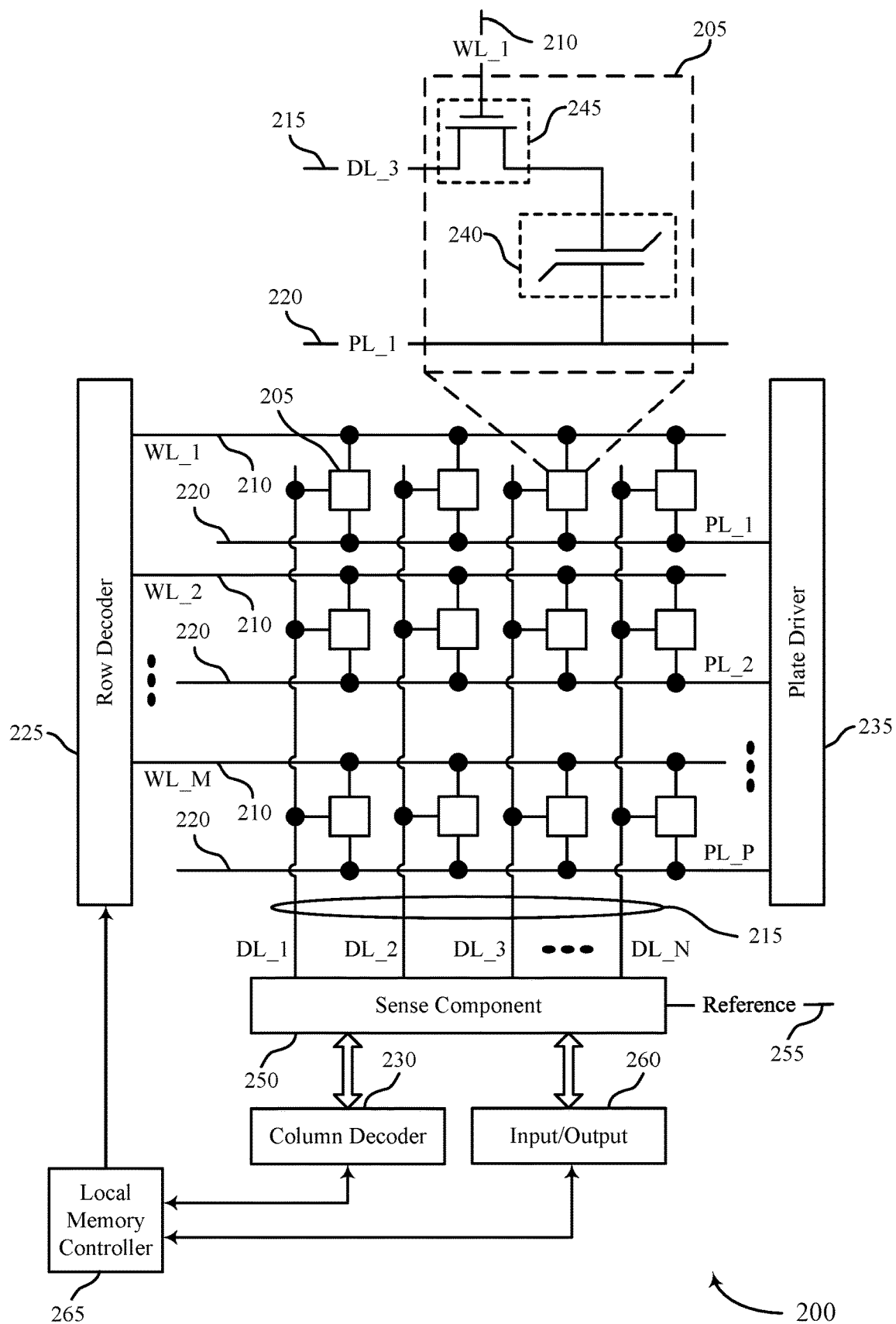
FIG. 2 illustrates an example of a memory die that supports completing memory repair operations interrupted by power loss in accordance with examples as disclosed herein.

FIG. 2 illustrates an example of a memory die 200 that supports completing memory repair operations interrupted by power loss in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from a local memory controller 265 and activate a word line 210 based on the received row address. A column decoder 230 may receive a column address from the local memory controller 265 and may activate a digit line 215 based on the received column address. A plate driver 235 may receive a plate address from the local memory controller 265 and may activate a plate line 220 based on the received plate address. The intersection of a word line 210 and a digit line 215, in either a two-dimensional or three-dimensional configuration, may be referred to as an address of a memory cell 205.

In some examples, one or more memory cells (e.g., memory cell 205) may become defective during the course of operation. To repair the defective memory cell 205 (or the row that includes the defective memory cell 205), the address of the row may be identified. In some examples, the address of the row that includes the defective memory cell 205 may be identified by the local memory controller 265 and communicated to a host device 105 or may be identified by the host device 105. The row address of the defective row (the row that includes the defective memory cell) may, in some examples, be stored to a bank (row) of storage elements associated with a redundant row, so as to repair the row that includes the defective memory cell 205. By storing the row address associated with the defective memory cell 205 to the bank of storage elements, subsequent access operations of the once-defective memory cell and the row that includes it may instead be conducted on the replacement redundant row of memory cells.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation may be controlled by applying a voltage to the transistor gate, where the voltage differential between the transistor gate and transistor source may be greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

In some examples, the local memory controller 265 may facilitate a memory repair operation as described herein. For example, the local memory controller 265 may receive a row address that corresponds to a defective row of memory cells (e.g., including memory cell 205). In some examples, the row address may be received from a host device 105. The local memory controller 265 may then determine a bank of storage elements to use, set a repair flag, and store the repair flag and the received row address in non-volatile memory. The local memory controller 265 may begin storing the received row address in the bank of storage elements. After a power interruption, the local memory controller 265 may obtain a repair flag, a row address, and an identification of a bank of storage elements from non-volatile memory and determine, by the repair flag, that the storing of the row address in the identified bank of storage elements was initiated and not completed. The local memory controller 265 may continue storing the row address in the bank of storage elements, determine if the storing was successfully completed, and update the repair flag in the non-volatile memory accordingly.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration. As described herein, a redundant row of memory cells may be utilized to repair (e.g., to "replace") a defective row of memory cells (e.g., a row that includes memory cell 205). By storing the address of the defective row of memory cells to a bank of storage elements, an access operation may be conducted on a redundant row of memory cells associated with the bank of storage elements, instead of on the defective row. Thus, in some examples, the memory repair operation described herein may utilize a redundant row of memory cells (e.g., redundant row 325-a as described with reference to FIG. 3).

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205. As described herein, a redundant row of memory cells may be utilized to repair (e.g., to "replace") a defective row of memory cells (e.g., a row that includes memory cell 205). By storing the address of the defective row of memory cells to a bank of storage elements, an access operation may be conducted on a redundant row of memory cells associated with the bank of storage elements, instead of on the defective row. Thus, in some examples, the memory repair operation described herein may utilize a redundant row of memory cells (e.g., redundant row 325-a as described with reference to FIG. 3).

Figure 3:
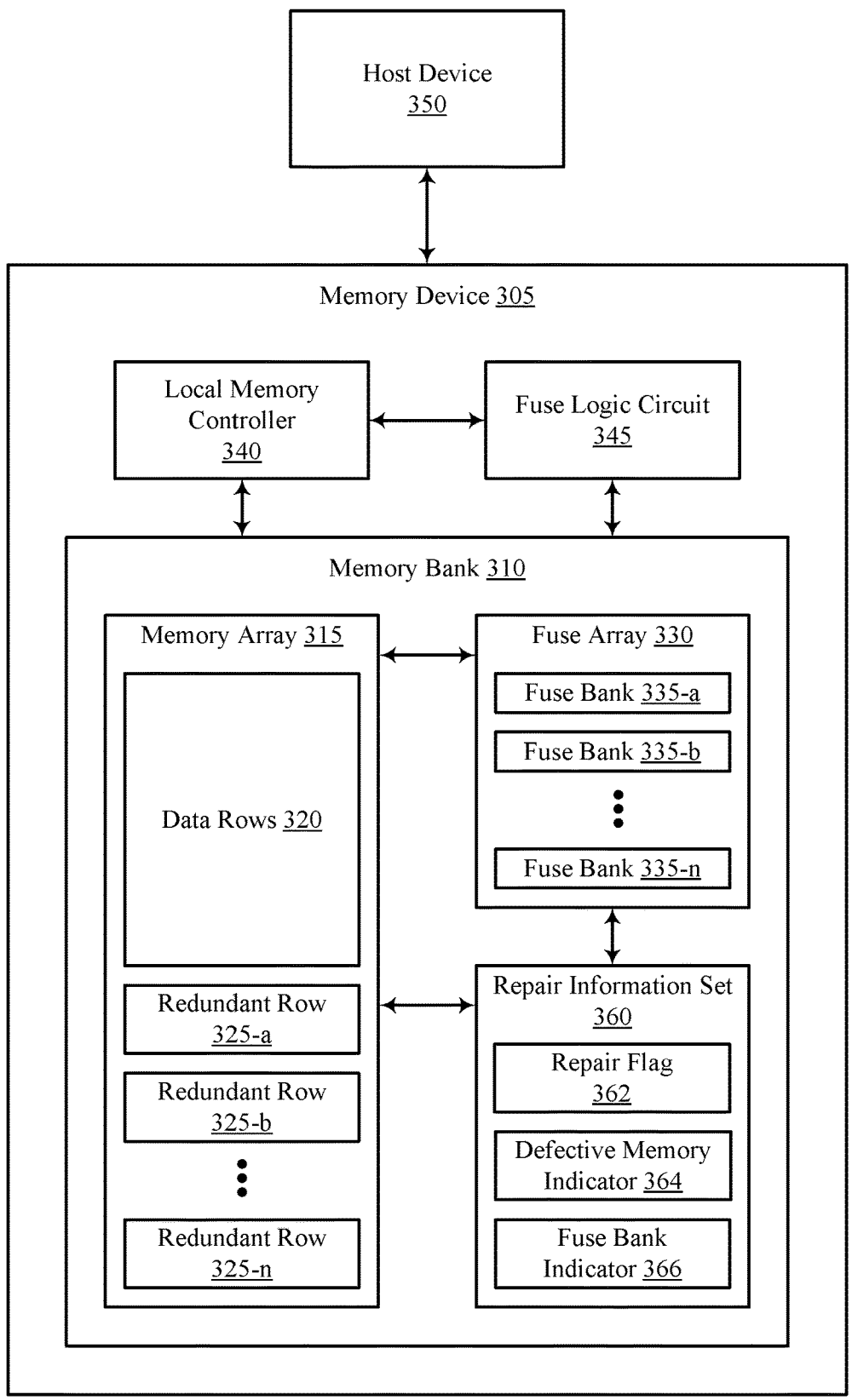
FIG. 3 illustrates an example of a system that supports completing memory repair operations interrupted by power loss in accordance with examples as disclosed herein.

FIG. 3 illustrates an example of a system 300 that supports completing memory repair operations interrupted by power loss in accordance with examples as disclosed herein. The system 300 may be an example of one or more aspects of system 100 as described with reference to FIG. 1. The system 300 may include a memory device 305, which may include a memory bank 310 coupled with a local memory controller 340 and a fuse logic circuit 345. In some examples, the memory device 305 may be coupled with a host device 350. As shown in FIG. 3, memory bank 310 may include a memory array 315, a fuse array 330, and a repair information set 360, coupled with each other. Further, as indicated above, wherever storage element or "fuse" is used herein, it is to be understood that a fuse or an anti-fuse or other one-time programmable storage element may be used, and that in some cases a non-volatile but reprogrammable storage element may be used. In some cases, the storage element or fuse may be self or auto-loading. That is, the storage element may not require a sense-amplifier or access operation to determine the logic state; it can be read/latched on power up. In some examples, the components of system 300 may operate to perform a memory repair operation (e.g., a PPR) that is interrupted by a power interruption as described herein.

Memory array 315 may include a plurality of data rows 320 (which may also be referred to as prime rows or prime data rows). In some examples, each individual data row 320 may be a row of memory cells connected to a single word line (e.g., a word line 210 as described with reference to FIG. 2) and may include a plurality of memory cells (e.g., a plurality of memory cells 205 as described with reference to FIG. 2). Each data row 320 may be associated with a particular address (row address) for data storage. For example, each data row 320 may have been initially assigned (e.g., during production) an address to be used in an access operation (e.g., during a normal or a non-PPR operation mode). Thus data may be read from and written to each memory cell of a respective data row 320 using its particular row address.

The memory bank 310 may also include a plurality of redundant rows 325. For example, redundant row 325-a may represent a first redundant row, redundant row 325-b may represent a second redundant row, and redundant row 325-n may represent an Nth redundant row (e.g., a 96th redundant row) of the memory array 315. Although the redundant rows 325 are illustrated as being co-located with data rows 320 (e.g., in memory array 315), in some examples one or more of the redundant rows 325 may be physically separate from the data rows 320 (e.g., located in a separate array or on a separate substrate).

As described herein, one or more data rows 320 may become defective. Accordingly, the redundant rows 325 may serve to selectively store data responsive to remapping an address associated with a defective data row 320 by storing the remapped address in a fuse bank 335 corresponding to (e.g., that maps to) a redundant row 325. For example, a first data row 320 may be identified as defective and its address may be remapped (e.g., using fuse logic circuit 345 and fuse array 330) to a redundant row 325 such that the data formerly associated with the defective data row 320 may be stored to and accessed (e.g., read from or written to) via redundant row 325. Stated another way, a redundant row 325 may be used to repair (e.g., "replace") a data row 320 in the event that the data row 320 becomes defective.

Fuse array 330 may include a plurality of fuse banks 335. For example, fuse bank 335-a may represent a first fuse bank, fuse bank 325-b may represent a second fuse bank, and fuse bank 325-n may represent an Nth fuse bank (e.g., a 96th fuse bank) of the memory bank 310. In some cases, as used herein, a fuse bank 335 may be collectively referred to as a storage element. In some examples, each fuse bank 335 may include one or more fuses. Each fuse may in some cases be a one-time programmable storage element. Though one fuse array 330 is shown for simplicity, it is to be understood that a memory device 305 may include any number of fuse arrays 330 and any number of fuse banks 335. It is also to be understood that fuse banks 335 may be distributed across any number of fuse arrays 330.

Although the fuse banks 335 are illustrated as being located within memory bank 310 and coupled with memory array 315, in some examples the fuse banks 335 may be physically separate from the memory bank 310 and may be in indirect communication with the memory array 315 via one or more components (e.g., a local memory controller 340 or a data path such as a bus).

In some examples the fuse array 330 may be coupled with the memory array 315 such that fuse banks 335 may map addresses associated with defective data rows 320. Stated another way, one or more of data rows 320 may become defective, and one or more redundant rows 325 (e.g., redundant row 325-a) may be used to repair (e.g., "replace") the defective data rows 320, where the fuse banks 335 may map addresses associated with the defective data rows 320 to corresponding redundant rows 325.

In some cases, because an individual fuse bank 335 may map the address associated with a defective data row 320 to a corresponding redundant row 325, a 1:1 relationship between fuse banks 335 and redundant rows 325 may exist. A fuse search operation may occur to identify one or more fuse banks 335 that remain available for use in a memory repair (e.g., PPR) operation. Accordingly, when an individual data row 320 becomes defective, a fuse bank 335 identified as available may store the address of the defective data row 320, which may result in a corresponding redundant row 325 being accessed in subsequent access operations (e.g., as opposed to the defective data row 320 being accessed).

In some examples, each storage element in a fuse bank 335 may be a fuse or an anti-fuse. Both a fuse and an anti-fuse may be a one-time programmable device—meaning that each fuse bank 335 may be capable of storing a defective row address one time. A fuse may store a bit based on whether an electrically conductive path through the fuse has been broken (e.g., due to a current passing through the fuse exceeding a predefined level). Conversely, for example, an anti-fuse may store a bit based on whether an electrically conductive path has been formed through the anti-fuse (e.g., due to a voltage across through the anti-fuse exceeding a predefined level). In some cases, the storage element may be self or auto-loading. That is, the storage element may not require a sense-amplifier or access operation to determine the logic state; it can be read/latched on power up. Whether the storage element comprises a fuse or an anti-fuse or some other type of storage element (one-time programmable or otherwise), a set or row of storage elements, such as a fuse bank 335, may be configured to store the row address associated with the defective data row 320, which may allow for a corresponding redundant row 325 to be accessed during a subsequent access operation.

Memory bank 310 may include a repair information set 360. Repair information set 360 may include information corresponding to a memory repair (e.g., PPR) operation that may be in progress. In some examples, repair information set 360 may be stored in non-volatile memory. In some examples, memory bank 310 may comprise volatile memory and non-volatile memory and repair information set 360 may be stored in the non-volatile memory. In some examples, memory bank 310 may comprise memory cells each usable as volatile and non-volatile memory (e.g., FeRAM) and repair information set 360 may be stored in the memory cells being used as non-volatile memory. Although repair information set 360 is illustrated as being located within memory bank 310 and coupled with memory array 315 and fuse array 330, in some examples repair information set 360 may be physically separate from memory bank 310 and may be in indirect communication with memory array 315 and/or fuse array 330 via one or more components (e.g., a local memory controller 340).

In some examples, repair information set 360 may include a repair flag 362, a defective memory identifier 364 and a fuse bank identifier 366. Repair flag 362 may indicate that a memory repair operation is in progress. Repair flag 362 may be set at the initiation of the memory repair operation and cleared at the completion of the memory repair process. Defective memory identifier 364 may include an identifier of the defective memory (e.g., data row) being repaired (e.g., "replaced") by the memory repair operation. In some examples, the defective memory identifier 364 may include an address of the defective memory. In some examples, the defective memory identifier 364 may include an address of a defective data row 320 of the memory array 315. Fuse bank identifier 366 may identify the fuse bank being used by the memory repair operation to repair (e.g., "replace") the defective memory. In some examples, fuse bank identifier 366 may include an indication of the location of the fuse bank 335 being used by the memory repair operation. In some examples, fuse bank identifier may include an address of the fuse bank 335 being used by the memory repair operation.

Some or all of the information of repair information set 360 may be stored in non-volatile memory at the beginning or ending of the memory repair operation, or both. In some examples, the repair flag 362 may be set, and the repair flag 362, the defective memory identifier 364, and/or the fuse bank identifier 366 may be stored in the non-volatile memory at the beginning of the memory repair operation. In some examples, the repair flag 362, the defective memory identifier 364, and/or the fuse bank identifier 366 may be stored in non-volatile memory before any fuses are programmed. In some examples, the repair flag 362, the defective memory identifier 364, and/or the fuse bank identifier 366 may be cleared in the non-volatile memory at the completion of the memory repair operation.

This may facilitate the completion of the memory repair operation after a power interruption when the memory repair operation is initiated but not completed before the power interruption. This is discussed in greater detail below with reference to FIG. 4.

In some examples, the local memory controller 340 may communicate with the memory bank 310 to facilitate a memory repair operation. For example, the local memory controller 340 may receive a row address that corresponds to a defective data row 320. In some examples, the row address may be received from the host device 350—meaning that the host device 350 may determine that a data row is defective— or from another controller internal to the memory device 305 (e.g., a device memory controller 155), where the host device 350 or the other internal controller may have determined that the data row 320 is defective. In other examples, the local memory controller 340 may determine, independent from the host device 350, that the data row 320 is defective. In some examples, the local memory controller 340 may then determine an address (e.g., a row address) associated with the defective data row 320.

After receiving the defective row address, the local memory controller 340 may determine whether a fuse bank 335 (e.g., of the fuse array 330) is available to store the received row address. In some examples, this determination may be made based on one or more signals received from the fuse logic circuit 345. For example, the fuse logic circuit 345 may determine that fuse bank 335-a is available and communicate its availability to the local memory controller 340.

In some examples, the local memory controller 340 may store the received row address (of the defective data row 320) in the fuse bank 335 (e.g., fuse bank 335-a) based at least in part on determining that the fuse bank 335 is available. That way, the fuse bank will reflect (e.g., "map") the defective data row. The local memory controller 340 may store the row address in the fuse bank 335 by programming the fuses of the fuse bank 335. By storing the received row address in the fuse bank 335, the corresponding redundant row 325 (e.g., redundant row 325-a) may be used to repair (e.g., "replace") the defective data row 320. In subsequent access operations (e.g., read operations and write operations), the received row address stored in the fuse bank 335 may indicate that the redundant row 325 (e.g., redundant row 325-a) associated with the fuse bank 335 (e.g., fuse bank 335-a) is to be accessed instead of the defective data row 320.

In some examples, the local memory controller 340 may use the repair information set 360 to indicate the status of the storage of the received row address in the fuse bank 335. For example, at the beginning of the memory control operation, the local memory controller 340 may set a repair flag and store the repair flag, the address of the defective data row 320, and the address of the fuse bank (e.g., fuse bank 335-a) respectively as the repair flag 362, the defective memory identifier 364, and the fuse bank identifier 366 in the non-volatile memory. In some examples, the local memory controller 340 may perform the storage of this information before programming any of the fuses of the fuse bank 335. In some examples, after the received row address has been programmed into the fuse bank 335 (e.g., fuse bank 335-a), the local memory controller 340 may clear the repair information set 360 in the non-volatile memory to indicate that the memory repair operation has been completed. For example, the local memory controller 340 may clear the repair flag 362, the defective memory identifier 364, and the fuse bank identifier 366 in the non-volatile memory. A method of using repair information set 360 in this manner is discussed in greater detail below with reference to FIG. 4.

As described herein, the fuse logic circuit 345 may communicate with the memory bank 310 and the local memory controller 340 in a memory repair operation. In some examples, the fuse logic circuit 345 may include one or more components (e.g., logic gates or other components) configured to facilitate a memory repair operation. To conduct a PPR operation, the fuse logic circuit 345 may communicate directly with the memory bank 310. In other examples, the fuse logic circuit 345 may communicate with both the memory bank 310 and local memory controller 340 to conduct one or more aspects of the operation. For example, the fuse logic circuit 345 may aid in a determination of whether a particular fuse bank 335 is available or whether an address associated with a defective data row 320 of memory cells has already been stored to a fuse bank 335. In some examples, any one or more of the functions ascribed herein to the fuse logic circuit 345 may be performed by the local memory controller 340.

In some examples, the fuse logic circuit 345 may conduct a fuse search and/or a fuse broadcast operation. A fuse search operation may, for example, comprise scanning fuse banks 335 to determine or identify one or more fuse banks 335 that are available for a memory repair operation. The fuse search operation may scan any number of fuse banks 335 in searching for an available fuse bank 335. Additionally or alternatively, a fuse broadcast operation may comprise scanning one or more fuse banks 335 to read the contents of each fuse bank 335 (e.g., for transferring the contents to mode registers or other storage within the memory device 305). A fuse broadcast operation may be conducted, for example, to identify row addresses (for data rows 320) that have been stored to fuse banks 335 so as to map to the redundant rows associated with those fuse banks 335 rather than the defective data rows 320 during subsequent access operations. In some examples, a fuse bank operation may be conducted to determine if a memory repair operation is complete. The fuse bank operation may obtain a row address stored in a fuse bank 335 so the stored row address can be compared to the defective row address. If the stored row address is equal to the defective row address, the memory repair operation may be complete.

As described herein, a host device 350 may be coupled with the memory device 305. In some examples, the host device 350 may communicate directly with the local memory controller 340 and/or the fuse logic circuit 345. The host device 350 may indicate to the memory device 305, for example, that a memory repair operation is to commence. In some examples, the host device 350 may transmit a PPR command, an activation command, and/or a defective row address to the memory device. For example, the memory device 305 may be operating in an idle or operational mode, and the host device 350 may transmit, to the memory device, a command to enter PPR mode based on a determination that a row of memory cells (e.g., of data rows 320) is defective. As described herein, this determination may be made by either the host device 350 or the local memory controller 340.

In some examples, after transmitting the command to enter PPR mode, the host device 350 may transmit an activate command to the memory device 305. An activate command may include or be transmitted concurrently or otherwise in association with an address of a defective data row 320. In some examples, the activate command may also initiate a fuse search and/or a fuse broadcast operation to determine an available fuse bank 335. After the address has been stored to the available fuse bank 335, the PPR operation may end, and any subsequent access operations associated with the address may utilize the redundant row 325 (e.g., instead of the defective data row 320) corresponding to the newly utilized fuse bank 335.

In some examples, the host device 350 or local memory controller 340 may use repair information set 360 to determine the status of the storage of the received row address in the fuse bank 335, as discussed herein.

Figure 4:
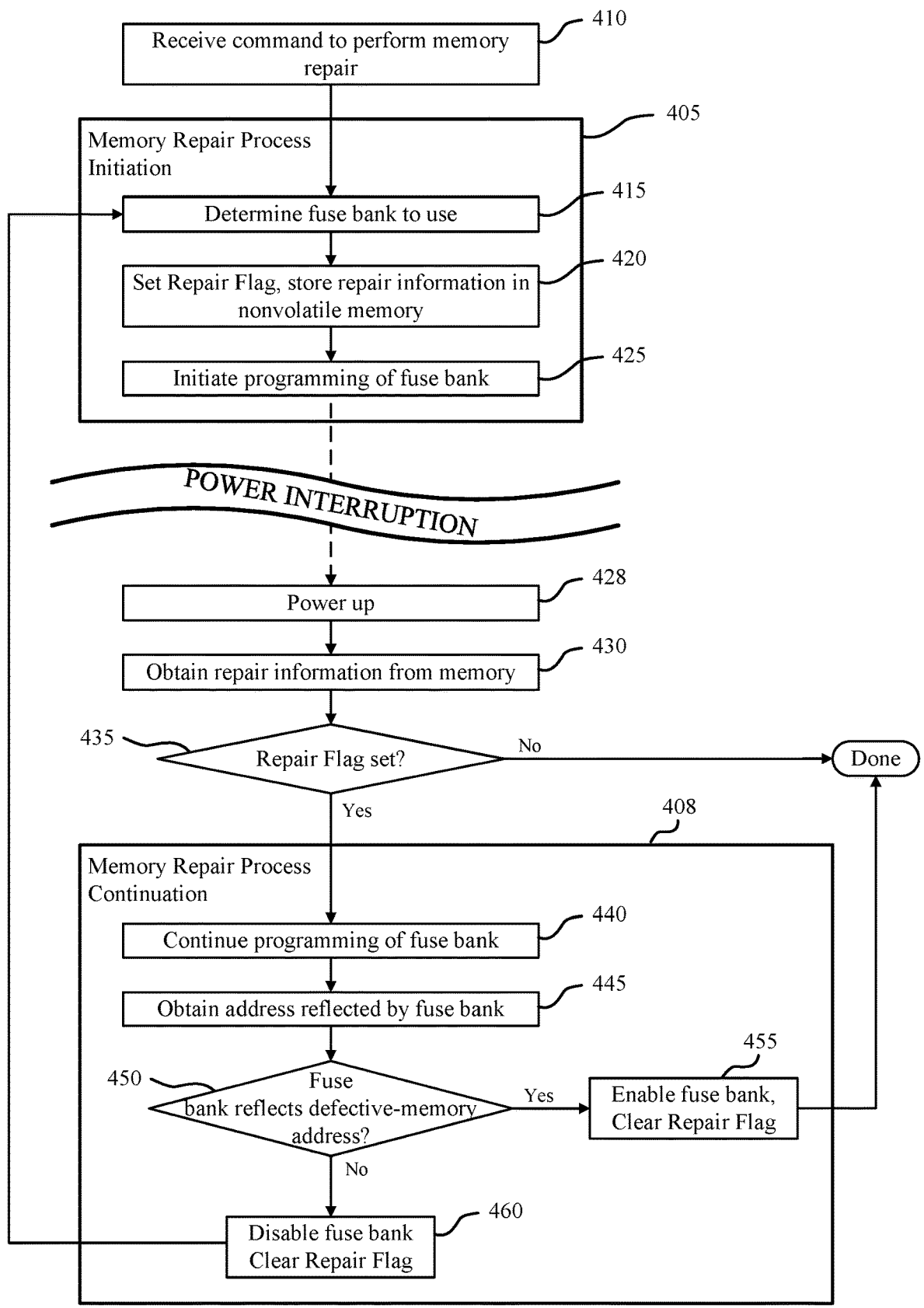
FIG. 4 shows a flowchart illustrating an example of a method that supports completing memory repair operations interrupted by power loss in accordance with examples as disclosed herein.

FIG. 4 shows a flowchart illustrating an example of a method 400 that supports completing memory repair operations interrupted by power loss in accordance with examples as disclosed herein. The operations of method 400 may be implemented by a memory system or its components as described herein. For example, the operations of method 400 may be performed by a memory device 110 as described with reference to FIG. 1. In some examples, a memory system may execute a set of instructions to control the functional elements of the memory device to perform the described functions. Additionally or alternatively, a memory device may perform aspects of the described functions using special-purpose hardware. Method 400 may facilitate the completion of a memory repair operation after a power interruption when the memory repair operation is initiated but not completed before the power interruption Using method 400, when a defect occurs at a memory address (e.g., a data row 320), a memory repair operation may be performed in which the defective memory may be disabled and a corresponding replacement memory may be enabled to repair (e.g., "replace") the defective memory. In some examples, the memory repair operation may include programming a fuse bank (e.g., fuse bank 335-a) to reflect (e.g., "map") the address of a defective memory (e.g., a defective data row 320). By storing the defective memory address in the fuse bank, a redundant set of memory cells (e.g., redundant row 325-a) corresponding to the fuse bank, may be used instead of the defective memory. Then, in subsequent access operations (e.g., read operations and write operations), the redundant memory (e.g., redundant row 325-a) may be accessed instead of the defective memory (e.g., defective data row 320).

Method 400 allows the memory repair operation to be performed even when interrupted by a power interruption, e.g., due to a power outage or a hard reset of the memory device. That is, the memory repair operation may be initiated before the power is removed and completed after the power returns.

Method 400 may be used to perform a memory repair operation that spans a power interruption. The memory repair operation may include a memory repair process initiation 405 that may be performed before the power interruption and a memory repair process continuation 408 that may be performed after the power interruption. In method 400, memory repair process initiation 405 may include one or more of steps 415 through 425 and memory repair process continuation 408 may include one or more of steps 440 through 460.

At 410, a command to perform a memory repair may be received. In some cases, the command may be received from a host device or a memory controller (e.g., host device 350 or memory controller 340). In some cases, the command may include a memory address ("defective-memory address") indicating a location within the memory device in which the data error has occurred. The defective-memory address may be an address of a defective row in a memory array of the memory device. In some examples, the command may indicate that a PPR operation is to be performed. In some cases, the command may include a PPR command, an activation command, and the address of a defective row of the memory array. In some examples, a command may be received to enter PPR mode based on a determination that a row of memory cells (e.g., of data rows 320) is defective. As described herein, this determination may be made by either the host device 350 or the local memory controller 340. In some examples, after receiving the command to enter PPR mode, an activate command may be received. The activate command may include or be received concurrently or otherwise in association with an address of a defective data row 320.

After receiving the command, the memory repair operation may be performed. The memory repair operation may include performing a memory repair process initiation 405 and a memory repair process continuation 408. Memory repair process initiation 405 may include one or more of steps 415, 420, and 425. Memory repair process initiation 405 may include determining a fuse bank to use, setting and storing repair information in non-volatile memory, and programming the one or more of the fuses in the fuse bank to reflect the defective-memory address.

At 415, a fuse bank to use for the memory repair operation may be determined. In some examples, the fuse bank may correspond to a fuse bank 335 discussed previously with reference to FIG. 3. In some examples, a fuse search and/or a fuse broadcast operation may be used to determine the fuse bank, as discussed herein. In some examples, the fuse search and/or fuse broadcast operation may be initiated by receipt of a received activate command. In some examples, whether the defective-memory address has been previously stored to a fuse bank 335 may be determined by the local memory controller 340 and/or the fuse logic circuit 345. If an attempt was made to previously store the defective-memory address in a particular fuse bank (e.g., if 415 is entered from 460), a new fuse bank, different than the previous fuse bank, may be determined.

At 420, a repair flag may be set and repair information may be stored in non-volatile memory. The repair flag may be set to indicate initiation of the memory repair process. The repair information may include the repair flag, the defective-memory address received in the command at 410, and/or a location of the fuse bank determined at 415. The defective-memory address may be an address of a defective row of a memory array of the memory device. In some cases, the repair flag may be set by the memory device. In some cases, the repair information may be stored by the memory device. In some cases, the repair information may correspond to repair information set 360 discussed previously with reference to FIG. 3: the repair flag, the defective-memory address, and the location of the fuse bank may respectively correspond to repair flag 362, defective memory identifier 364, and fuse bank identifier 366.

At 425, programming of the fuse bank may be initiated. The programming may be performed to cause an address reflected by the fuse bank to equal the defective-memory address received in the command at 410 and stored in the non-volatile memory. In some cases, the programming may be initiated after the repair flag has been set and the repair information has been stored in the non-volatile memory. In some examples, the programming of the fuse bank may include programming the fuses of the fuse bank. Programming the fuses may include passing currents through the fuses to exceed a predefined level (to open a conductive path of a fuse, or close a conductive path of an antifuse).

During the memory repair operation, a power interruption may occur. That is, a power interruption may occur before all of the fuses of the fuse bank have been programmed.

At 428, a power up of the memory device may occur. The power up may include obtaining memory information, setting up registers, etc. for memory device functionality. In some examples, the power up may be performed after a power interruption of the memory device. In some examples, it may not be known what was occurring or in progress before the power interruption occurred. As such, it may not be known at power up if a memory repair operation had been initiated before the power interruption and if so, whether the memory repair had been completed. In some examples, when the power up occurs, information previously stored in the non-volatile memory may still be accessible. In some examples, logic states stored by the storage elements or fuses may be read (e.g., latched) at power up of the memory device. For example, the logic states of fuses used for the memory repair operation may be latched at power up.

At 430, memory repair information may be obtained from the non-volatile memory. In some examples, the memory repair information may correspond to the repair information stored in the non-volatile memory at step 420. For example, the repair information may include a repair flag, a defective-memory address, and/or a location of a fuse bank of the memory device. In one example, the repair information may include repair flag 362, defective memory identifier 364, and fuse bank identifier 366 of repair information set 360. The defective-memory address may indicate a location within the memory device in which a data error has occurred. The defective-memory address may be an address of a defective row in a memory array of the memory device.

In some examples, the memory repair information may be obtained at power up of the memory device. In some examples, the memory repair information may be obtained after a power interruption of the memory device. In some examples, the memory repair information may be used to determine whether a memory repair (e.g., PPR) operation was initiated but not completed before the power interruption.

At 435, it may be determined if the repair flag obtained at 430 is set. If the repair flag is not set, there may be no memory repair operations waiting to be completed and the method may be complete. In some cases, the memory repair operations associated with receiving the command may be ceased. For example, if a memory repair operation is completed before power interruption, the repair flag may have been cleared and the memory repair process continuation (or other subsequent control operations), may not be initiated.

If the repair flag is set, a memory repair operation may have been initiated but not completed before the power interruption, and the method may continue to step 440 to continue the memory repair operation.

Memory repair process continuation 408 may continue the memory repair operation begun in memory repair process initiation 405. Memory repair process continuation 408 may include one or more of steps 440, 445, 450, 455, and 460. Memory repair process continuation 408 may include continuing the programming of the fuses in the fuse bank, determining if the programming was successful, and updating the memory repair information accordingly.

At 440, programming of the fuse bank, that began at 425, may be continued. The identification of the fuse bank may be part of the memory repair information obtained at 430. For example, fuse bank identifier 366 may be used and may correspond to the address of the fuse bank. The programming may be performed to cause the address reflected by the fuse bank to equal the defective-memory address obtained at 430. After completion of the programming of the fuse bank, the method may continue to step 445 to determine if the memory repair operation was successful.

At 445, the address reflected by the fuse bank may be obtained. As discussed above, the identification of the fuse bank may be part of the memory repair information obtained at 430. In one example, a fuse bank broadcast may be performed to determine the address reflected by the fuse bank, as discussed herein.

At 450, the address reflected (e.g., "mapped") by the fuse bank, obtained at 445, may be compared to the defective-memory address obtained at 430. If the addresses match, the defective-memory address has been completely programmed into the fuse bank. As such, the memory repair operation was successful and the method may continue to step 455.

If the address reflected by the fuse bank does not equal the defective-memory address, the defective-memory address has not been completely programmed into the fuse bank. As such, the memory repair operation has been unsuccessful and the method may continue to step 460.

At 455, since the memory repair operation was successfully completed, the repair flag may be cleared to indicate completion of the memory repair operation and the fuse bank may be enabled. In some examples, the repair flag may be cleared by clearing the repair flag in the repair information stored in the non-volatile memory, e.g., clearing repair flag 362 of repair information set 360. In some examples, the information stored in the non-volatile memory may be cleared, e.g., repair flag 362, defective memory identifier 364, and fuse bank identifier 366 of repair information set 360 may be cleared. In some examples, the fuse bank may be enabled by programming an enable bit in the fuse bank.

In some cases, the memory repair process continuation may be exited and the method may be ceased.

At 460, since the memory repair operation was unsuccessful, the repair flag may be cleared to indicate completion of the repair operation, but the fuse bank may be disabled to signify that the fuse bank may be unusable. In some examples, the repair flag may be cleared by clearing the repair flag in the repair information stored in the non-volatile memory, e.g., repair flag 362 of repair information set 360. In some examples, the information stored in the non-volatile memory may be cleared, e.g., repair flag 362, defective memory identifier 364, and fuse bank identifier 366 of repair information set 360 may be cleared. In some examples, the fuse bank may be disabled by programming a disable bit in the fuse bank. The method may then exit memory repair process continuation 408 and return to 415 to perform a new memory repair operation using a different fuse bank. The new memory repair operation may be performed with or without the occurrence of a new power interruption.

In some cases, instead of returning to 415 to perform a new memory repair operation, method 400 may be complete after step 460.

In some cases, at the completion of method 400, a message may be sent, e.g., to the host system. The message may include information about the memory repair operation, such as whether the operation was successful, etc. In some cases, a message may be sent only if the operation was unsuccessful after completion of method 400.

Figure 5:
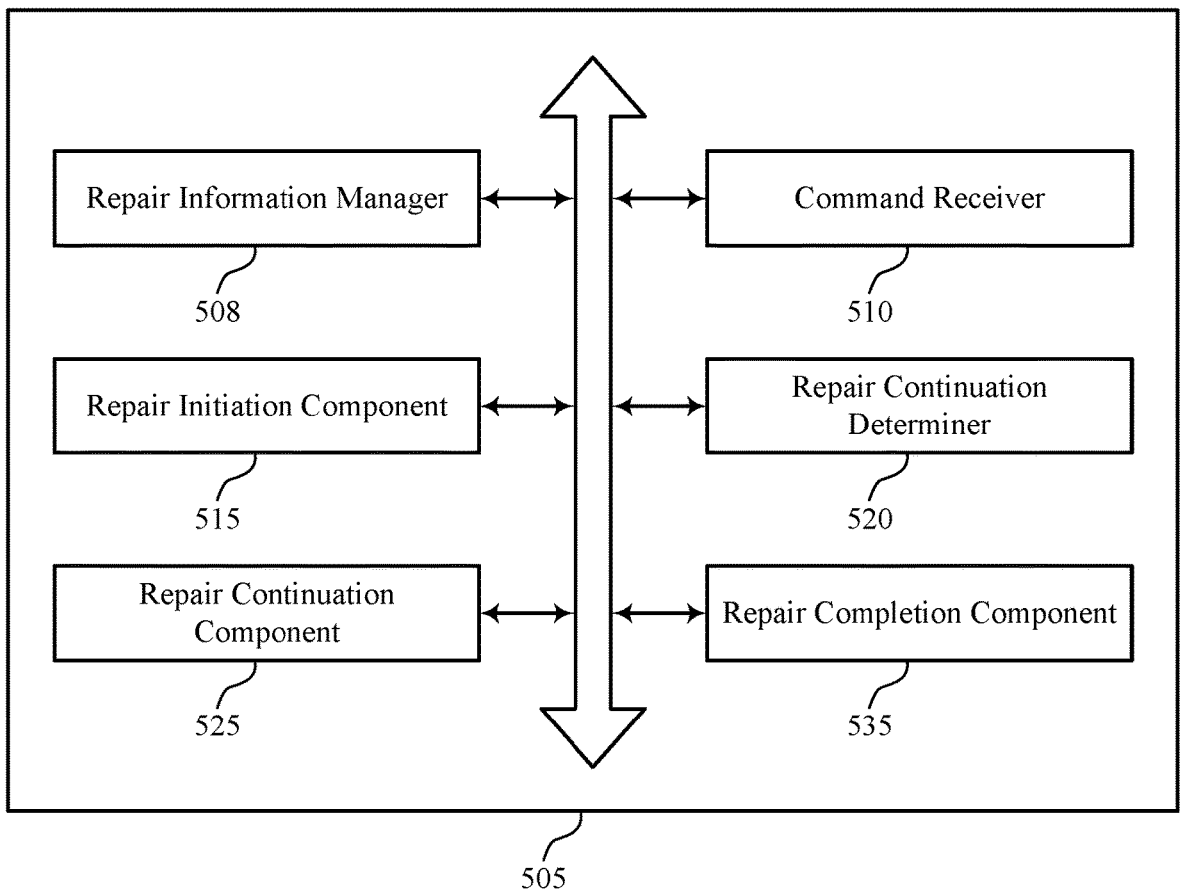
FIG. 5 shows a block diagram of a memory system that supports completing memory repair operations interrupted by power loss in accordance with examples as disclosed herein.

One or more of the steps of method 400 may operate to perform a memory repair operation (e.g., a PPR) that is interrupted by a power interruption. It may facilitate the completion of the memory repair operation after a power interruption when the memory repair operation is initiated but not completed before the power interruption FIG. 5 shows a block diagram 500 of a memory system 505 that supports completing memory repair operations interrupted by power loss in accordance with examples as disclosed herein. The memory system 505 may be an example of aspects of a memory system as described with reference to FIGS. 3 and 4. The memory system 505 may include a repair information manager 508, a command receiver 510, a repair initiation component 515, a repair continuation determiner 520, a repair continuation component 525, and a repair completion component 535. Each of these modules may communicate, directly or indirectly, with one another (e.g., via one or more buses).

The repair information manager 508 may manage memory repair information in a non-volatile memory of a memory device. The repair information manager 508 may store memory repair information in the non-volatile memory of the memory device and may obtain the repair information from the non-volatile memory. In some examples, the repair information manager 508 may store, in the non-volatile memory, information associated with the initiated memory repair process. In some examples, storing the information may include setting a repair flag at initiation of the memory repair process and clearing the repair flag at completion of the memory repair process. In some examples, the repair information manager 508 may clear the repair information from the non-volatile memory upon completion of the memory repair process. In some examples, clearing the information includes clearing the repair flag to indicate completion of the memory repair process.

The repair information manager 508 may obtain the repair information at power up of the memory device. In some examples, the memory device may include memory cells usable as volatile and non-volatile memory cells and the repair information manager 508 may store the information in the memory cells when the memory cells are used as non-volatile memory cells. In some cases, the repair information may include a repair flag, an address of a first row of a memory array of the memory device, and a location of a set of fuse elements of the memory device. The set of fuse elements may include a first portion and a second portion different than the first portion.

The command receiver 510 may receive a command to perform a memory repair of a memory device. The command may include an address of a defective row of the memory device.

The repair initiation component 515 may initiate a memory repair process of the memory device. The memory repair process may include programming a set of fuse elements of the memory device. The memory repair process may include replacing a first row of a memory array of the memory device with a second row of the memory array. Initiating the memory repair process may include programming a first portion of the set of fuse elements. In some cases, the repair initiation component 515 may determine the set of fuse elements. The determination of the fuse bank may be based on receiving the command.

The repair continuation determiner 520 may determine if a memory repair process of the memory device has been initiated and not completed. The determination may be made during powerup of the memory device. The determination may be based on the repair information stored in the non-volatile memory. In some examples, the repair continuation determiner 520 may determine, based on the repair information, that a memory repair process has been initiated and not completed. In some examples, determining that the memory repair process has been initiated and not completed may include determining that a repair flag of the repair information is set.

The repair continuation component 525 may continue the memory repair process of the memory device. The continuation of the memory repair process may be based on determining that the memory repair process has been initiated and not completed. In some examples, the repair continuation component 525 may program one or more of the set of fuse elements. In some examples, programming the one or more of the set of fuse elements may include programming all of the fuse elements. In some examples, programming the one or more of the set of fuse elements may include programming a subset of the set of fuse elements for which the repair process has not been completed. The subset may be determined based on the repair information. The programming of the fuse elements may be based on determining that the repair process has not been completed. Continuing the memory repair process may include programming a second portion of the set of fuse elements.

In some examples, the programming of the one or more fuse elements may be based on determining that the set of fuse elements fail to reflect the address of the first row. In some examples, the repair continuation component 525 may reprogram the one or more of the set of fuse elements, based on a determination that intermediate logic states of the fuse elements fail to correspond to the repair information.

The repair completion component 535 may determine if the memory repair operation is completed. In some examples, the repair completion component 535 may compare the repair information to logic states of the set of fuse elements of the memory device. The comparison may be performed subsequent to programming the one or more of the set of fuse elements. In some examples, the repair completion component 535 may determine that the memory repair operation is completed by determining that the logic states of the set of fuse elements correspond to the repair information. The determination may be based on comparing the repair information to the logic states of the set of fuse elements. The determination may be performed subsequent to programming the one or more of the set of fuse elements.

In some examples, the repair completion component 535 may determine that the set of fuse elements fail to reflect an address of the first row of the memory array. In some examples, the repair completion component 535 may determine that the intermediate logic states of the set of fuse elements fail to correspond to the repair information. The determination may be based on comparing the repair information to the intermediate logic states of the set of fuse elements.

Figure 6:
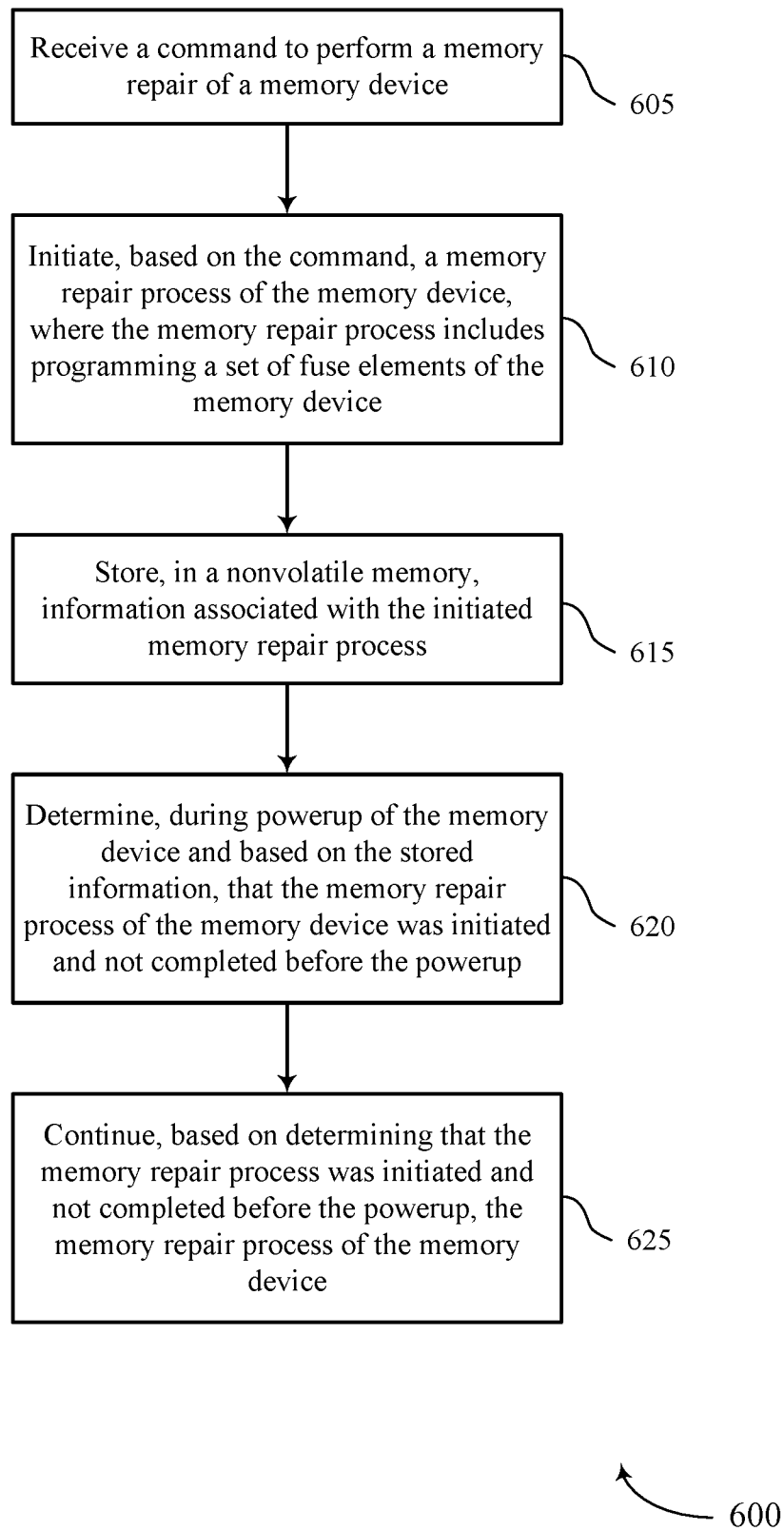
FIGS. 6 and 7 show flowcharts illustrating methods that support completing memory repair operations interrupted by power loss in accordance with examples as disclosed herein.

FIG. 6 shows a flowchart illustrating a method 600 that supports completing memory repair operations interrupted by power loss in accordance with examples as disclosed herein. The operations of method 600 may be implemented by a memory system or its components as described herein. For example, the operations of method 600 may be performed by a memory system as described with reference to FIG. 5. In some examples, a memory system may execute a set of instructions to control the functional elements of the memory system to perform the described functions. Additionally or alternatively, a memory system may perform aspects of the described functions using special-purpose hardware.

At 605, the method 600 may include receiving a command to perform a memory repair of a memory device. The operations of 605 may be performed according to the methods described herein. In some examples, aspects of the operations of 605 may be performed by a command receiver as described with reference to FIG. 5.

At 610, the method 600 may include initiating a memory repair process of the memory device, where the memory repair process may include programming a set of fuse elements of the memory device. The operations of 610 may be performed according to the methods described herein. In some examples, aspects of the operations of 610 may be performed by a repair initiation component as described with reference to FIG. 5.

At 615, the method 600 may include storing information associated with the initiated memory repair process in a non-volatile memory. The operations of 615 may be performed according to the methods described herein. In some examples, aspects of the operations of 615 may be performed by a repair information manager as described with reference to FIG. 5.

At 620, the method 600 may include determining, during powerup of the memory device, that the memory repair process of the memory device was initiated and not completed before the powerup, based on the stored information. The operations of 620 may be performed according to the methods described herein. In some examples, aspects of the operations of 620 may be performed by a repair continuation determiner as described with reference to FIG. 5.

At 625, the method 600 may include continuing the memory repair process of the memory device based on the determination that the memory repair process was initiated and not completed before the powerup. The operations of 625 may be performed according to the methods described herein. In some examples, aspects of the operations of 625 may be performed by a repair continuation component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for receiving a command to perform a memory repair of a memory device, initiating a memory repair process of the memory device, where the memory repair process includes programming a set of fuse elements of the memory device, storing, in a non-volatile memory, information associated with the initiated memory repair process, determining, during powerup of the memory device and based on the stored information, that the memory repair process of the memory device was initiated and not completed before the powerup, and continuing, based on determining that the memory repair process was initiated and not completed before the powerup, the memory repair process of the memory device.

Some examples of the method 600 and the apparatus described herein may further include operations, features, means, or instructions for clearing the information from the non-volatile memory upon completion of the memory repair process.

In some examples of the method 600 and the apparatus described herein, storing the information may include operations, features, means, or instructions for setting a repair flag to indicate initiation of the memory repair process and clearing the information may include operations, features, means, or instructions for clearing the repair flag to indicate completion of the memory repair process.

In some examples of the method 600 and the apparatus described herein, the memory repair process may include replacing a first row of a memory array of the memory device with a second row of the memory array of the memory device.

In some examples of the method 600 and the apparatus described herein, the information may include a repair flag, an address of the first row of the memory array, and a location of the set of fuse elements of the memory device.

In some examples of the method 600 and the apparatus described herein, the memory device may include memory cells usable as volatile and non-volatile memory cells and storing the information may include operations, features, means, or instructions for storing the information in the memory cells of the memory device when the memory cells are used as non-volatile memory cells.

Some examples of the method 600 and the apparatus described herein may further include operations, features, means, or instructions for determining the set of fuse elements based on receiving the command, the set of fuse elements including a first portion and a second portion different than the first portion.

In some examples of the method 600 and the apparatus described herein, initiating the memory repair process may include operations, features, means, or instructions for programming the first portion of the set of fuse elements and continuing the memory repair process may include operations, features, means, or instructions for programming the second portion of the set of fuse elements.

Figure 7:
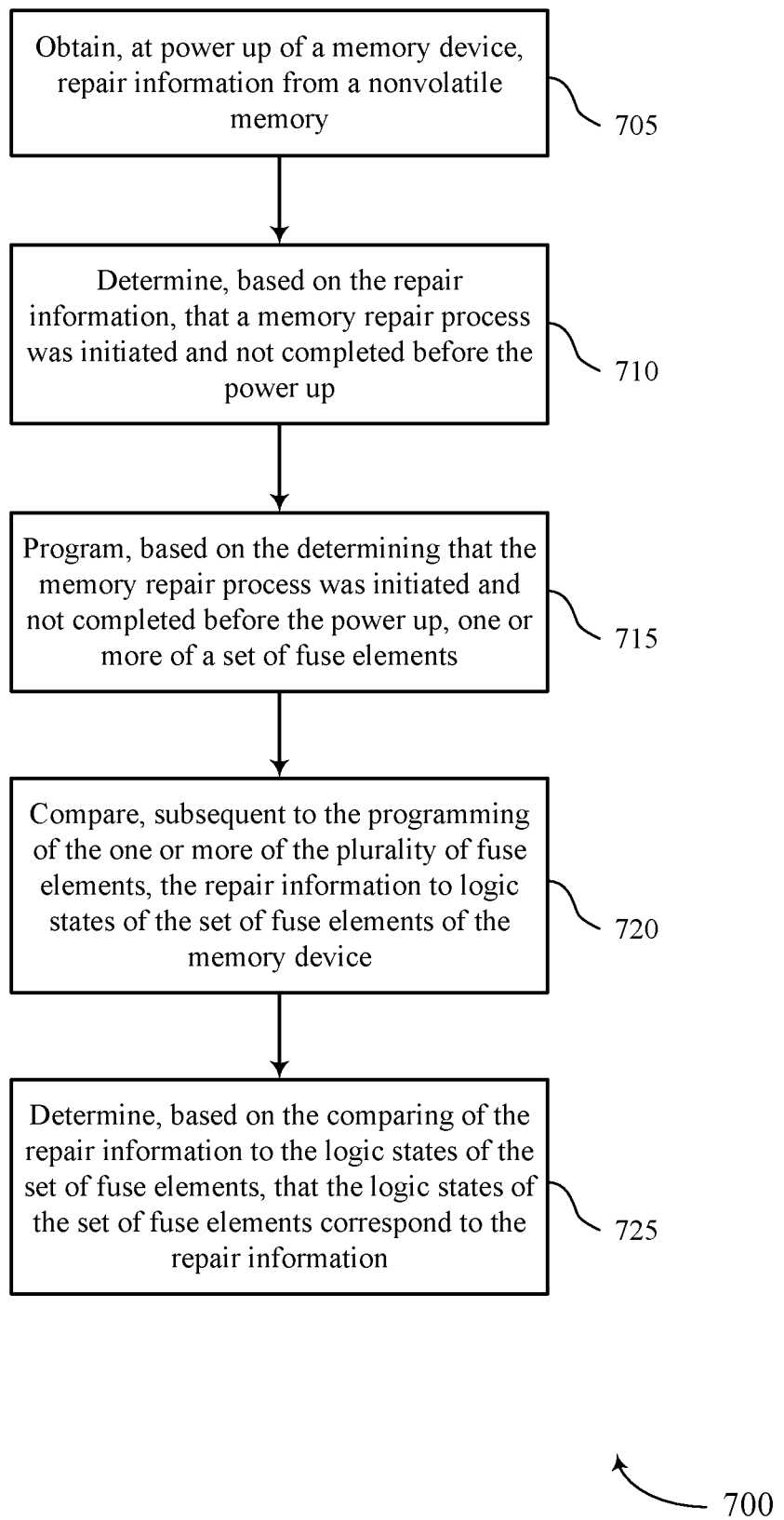

FIG. 7 shows a flowchart illustrating a method 700 that supports completing memory repair operations interrupted by power loss in accordance with examples as disclosed herein. The operations of method 700 may be implemented by a memory system or its components as described herein. For example, the operations of method 700 may be performed by a memory system as described with reference to FIG. 5. In some examples, a memory system may execute a set of instructions to control the functional elements of the memory system to perform the described functions. Additionally or alternatively, a memory system may perform aspects of the described functions using special-purpose hardware.

At 705, the method 700 may include obtaining repair information from a non-volatile memory at power up of a memory device. The operations of 705 may be performed according to the methods described herein. In some examples, aspects of the operations of 705 may be performed by a repair information manager as described with reference to FIG. 5.

At 710, the method 700 may include determining, based on the repair information, that a memory repair process was initiated and not completed before the power up. The operations of 710 may be performed according to the methods described herein. In some examples, aspects of the operations of 710 may be performed by a repair continuation determiner as described with reference to FIG. 5.

At 715, the method 700 may include programming one or more of a set of fuse elements, based on the determining that the memory repair process was initiated and not completed before the power up. The operations of 715 may be performed according to the methods described herein. In some examples, aspects of the operations of 715 may be performed by a repair continuation component as described with reference to FIG. 5.

At 720, the method 700 may include comparing the repair information to logic states of the set of fuse elements of the memory device subsequent to programming the one or more of the set of fuse elements. The operations of 720 may be performed according to the methods described herein. In some examples, aspects of the operations of 720 may be performed by a repair completion component as described with reference to FIG. 5.

At 725, the method 700 may include determining that the logic states of the set of fuse elements correspond to the repair information, based on comparing the repair information to the logic states of the set of fuse elements subsequent to programming the one or more of the set of fuse elements. The operations of 725 may be performed according to the methods described herein. In some examples, aspects of the operations of 725 may be performed by a repair completion component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for obtaining, at power up of a memory device, repair information from a non-volatile memory; determining, based on the repair information, that a memory repair process was initiated and not completed before the power up; programming, based on the determining that the memory repair process was initiated and not completed before the power up, one or more of a set of fuse elements; comparing, subsequent to the programming of the one or more of the set of fuse elements, the repair information to logic states of the set of fuse elements of the memory device; and determining, based on the comparing of the repair information to the logic states of the set of fuse elements, that the logic states of the set of fuse elements correspond to the repair information.

In some examples of the method 700 and the apparatus described herein, programming the one or more of the set of fuse elements may include operations, features, means, or instructions for programming all of the set of fuse elements.

In some examples of the method 700 and the apparatus described herein, determining that the repair process was initiated and not completed before power up may include operations, features, means, or instructions for determining that a repair flag of the repair information is set.

Some examples of the method 700 and the apparatus described herein may further include operations, features, means, or instructions for clearing the repair information, based at least in part on the determining that the logic states of the set of fuse elements correspond to the repair information.

In some examples of the method 700 and the apparatus described herein, determining that the repair process was initiated and not completed before power up may include operations, features, means, or instructions for determining that a repair flag of the repair information may be set, and clearing the repair information may include operations, features, means, or instructions for clearing the repair flag.

In some examples of the method 700 and the apparatus described herein, the repair process may include replacing a first row of a memory array of the memory device with a second row of the memory array.

In some examples of the method 700 and the apparatus described herein, the repair information may include a repair flag, an address of the first row of the memory array, and a location of the set of fuse elements of the memory device.

Some examples of the method 700 and the apparatus described herein may further include operations, features, means, or instructions for comparing, subsequent to the programming of the one or more of the set of fuse elements, the repair information to intermediate logic states of the set of fuse elements of the memory device; determining, based on the comparing of the repair information to the intermediate logic states of the set of fuse elements, that the intermediate logic states of the set of fuse elements fail to correspond to the repair information; and reprogramming, based on the determining that the intermediate logic states of the set of fuse elements fail to correspond to the repair information, the one or more of the set of fuse elements, where the comparing of the repair information to the logic states of the set of fuse elements may be performed subsequent to the reprogramming.

It should be noted that the methods described herein are possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers.

Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
receiving a command to perform a memory repair of a memory device;
initiating, based on the command, a memory repair process of the memory device, wherein the memory repair process comprises programming a plurality of fuse elements of the memory device;
storing, in a non-volatile memory, information associated with the initiated memory repair process;
determining, during powerup of the memory device and based on the stored information, that the memory repair process of the memory device was initiated and not completed before the powerup; and
continuing, based at least in part on the determining that the memory repair process was initiated and not completed before the powerup, the memory repair process of the memory device.

2. The method of claim 1, further comprising, clearing, upon completion of the memory repair process, the information from the non-volatile memory.

3. The method of claim 2, wherein:
storing the information comprises setting a repair flag to indicate initiation of the memory repair process; and
clearing the information comprises clearing the repair flag to indicate completion of the memory repair process.

4. The method of claim 1, wherein the memory repair process comprises replacing a first row of a memory array of the memory device with a second row of the memory array of the memory device.

5. The method of claim 4, wherein the information includes a repair flag, an address of the first row of the memory array, and a location of the plurality of fuse elements of the memory device.

6. The method of claim 1, wherein the memory device comprises memory cells usable as volatile and non-volatile memory cells, and wherein storing the information in a non-volatile memory comprises:
storing the information in the memory cells of the memory device when the memory cells are used as non-volatile memory cells.

7. The method of claim 1, further comprising:
determining the plurality of fuse elements based at least in part on receiving the command, the plurality of fuse elements comprising a first portion and a second portion different than the first portion, wherein:
initiating the memory repair process of the memory device comprises:
programming the first portion of the plurality of fuse elements; and
continuing the memory repair process of the memory device comprises:
programming the second portion of the plurality of fuse elements.

8. A memory device, comprising:
a memory array arranged in rows and columns;
a plurality of fuse elements;
a non-volatile memory; and
a controller coupled with the memory device and operable to cause the memory device to:
receive a command to perform a memory repair of the memory device;
initiate a memory repair process of the memory device, wherein the memory repair process includes programming the plurality of fuse elements;
store, in the non-volatile memory, information associated with the initiated memory repair process;
determine, during power up of the memory device and based on the stored information, that the memory repair process of the memory device was initiated and not completed before the power up; and
continue, based at least in part on determining that the memory repair process was initiated and not completed before the power up, the memory repair process of the memory device.

9. The memory device of claim 8, wherein the controller is further operable to cause the memory device to:
clear, upon completion of the memory repair process, the information.

10. The memory device of claim 9, wherein:
storing the information comprises setting a repair flag to indicate initiation of the memory repair process; and
clearing the information comprises clearing the repair flag to indicate completion of the memory repair process.

11. The memory device of claim 8, wherein the non-volatile memory comprises memory cells each usable as volatile and non-volatile memory cells, and wherein the information is stored in the memory cells when the memory cells are used as non-volatile memory cells.

12. The memory device of claim 8, wherein the memory repair process comprises replacing a first row of the memory array with a second row of the memory array and wherein the information includes a repair flag, an address of the first row of the memory array, and a location of the plurality of fuse elements of the memory device.

13. A method, comprising:
obtaining, at power up of a memory device, repair information from a non-volatile memory;
determining, based at least in part on the repair information, that a memory repair process was initiated and not completed before the power up;
programming, based at least in part on the determining that the memory repair process was initiated and not completed before the power up, one or more of a plurality of fuse elements;
comparing, subsequent to the programming of the one or more of the plurality of fuse elements, the repair information to logic states of the plurality of fuse elements of the memory device; and
determining, based at least in part on the comparing of the repair information to the logic states of the plurality of fuse elements, that the logic states of the plurality of fuse elements correspond to the repair information.

14. The method of claim 13, wherein programming the one or more of the plurality of fuse elements comprises programming all of the plurality of fuse elements.

15. The method of claim 13, wherein determining that the repair process was initiated and not completed before power up comprises determining that a repair flag of the repair information is set.

16. The method of claim 13, further comprising clearing, based at least in part on the determining that the logic states of the plurality of fuse elements correspond to the repair information, the repair information.

17. The method of claim 16, wherein:
    determining that the repair process was initiated and not completed before power up comprises determining that a repair flag of the repair information is set; and
    clearing the repair information comprises clearing the repair flag.

18. The method of claim 13, wherein the repair process comprises replacing a first row of a memory array of the memory device with a second row of the memory array.

19. The method of claim 18, wherein the repair information includes: a repair flag, an address of the first row of the memory array, and a location of the plurality of fuse elements of the memory device.

20. The method of claim 13, further comprising:
    comparing, subsequent to the programming of the one or more of the plurality of fuse elements, the repair information to intermediate logic states of the plurality of fuse elements of the memory device;
    determining, based at least in part on the comparing of the repair information to the intermediate logic states of the plurality of fuse elements, that the intermediate logic states of the plurality of fuse elements fail to correspond to the repair information; and
    reprogramming, based at least in part on the determining that the intermediate logic states of the plurality of fuse elements fail to correspond to the repair information, the one or more of the plurality of fuse elements, wherein the comparing of the repair information to the logic states of the plurality of fuse elements is performed subsequent to the reprogramming.

* * * * *